(12) United States Patent
Sitarski (10) Patent No.: US 8,736,432 B2
(45) Date of Patent: May 27, 2014

(54) TOUCH SENSOR HAVING A SELECTABLE SENSITIVITY LEVEL AND METHOD OF SELECTING A SENSITIVITY LEVEL OF A TOUCH SENSOR

(75) Inventor: Nicholas Scott Sitarski, Ypsilanti, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 302 days.

(21) Appl. No.: 13/154,561

(22) Filed: Jun. 7, 2011

(65) Prior Publication Data

US 2012/0313767 A1  Dec. 13, 2012

(51) Int. Cl.
- B60Q 1/00 (2006.01)
- G08B 6/00 (2006.01)
- G09B 21/00 (2006.01)
- H04B 3/36 (2006.01)

(52) U.S. Cl.
USPC ....... 340/425.5; 340/407.2; 701/36; 345/173; 345/174

(58) Field of Classification Search
USPC ............. 340/425.5, 407, 439, 461, 438; 324/684, 685; 345/178, 174, 173, 162, 345/184; 701/36, 33, 213
See application file for complete search history.

(56) References Cited

U.S. PATENT DOCUMENTS

| | | | | |
|---|---|---|---|---|
| 7,248,955 B2 * | 7/2007 | Hein et al. | | 701/36 |
| 7,639,238 B2 * | 12/2009 | Hauck | | 345/173 |
| 7,777,502 B2 * | 8/2010 | Grosser et al. | | 324/686 |
| 8,514,187 B2 * | 8/2013 | Dickinson et al. | | 345/173 |
| 2005/0035956 A1 * | 2/2005 | Sinclair et al. | | 345/184 |
| 2005/0062732 A1 * | 3/2005 | Sinclair et al. | | 345/184 |
| 2005/0137765 A1 * | 6/2005 | Hein et al. | | 701/36 |
| 2006/0202969 A1 * | 9/2006 | Hauck | | 345/173 |
| 2008/0047764 A1 * | 2/2008 | Lee et al. | | 178/18.06 |
| 2010/0096248 A1 * | 4/2010 | Yamauchi et al. | | 200/600 |
| 2010/0194692 A1 * | 8/2010 | Orr et al. | | 345/173 |
| 2010/0258361 A1 * | 10/2010 | Yamauchi et al. | | 178/18.06 |
| 2010/0302139 A1 * | 12/2010 | Luiro et al. | | 345/156 |
| 2011/0074701 A1 * | 3/2011 | Dickinson et al. | | 345/173 |
| 2011/0241850 A1 * | 10/2011 | Bosch et al. | | 340/384.6 |
| 2011/0298482 A1 * | 12/2011 | Tokudome | | 324/686 |
| 2012/0050229 A1 * | 3/2012 | Tenuta et al. | | 345/178 |
| 2012/0268411 A1 * | 10/2012 | Chen et al. | | 345/174 |
| 2012/0313767 A1 * | 12/2012 | Sitarski | | 340/425.5 |

FOREIGN PATENT DOCUMENTS

EP    1876711 A1    1/2008
JP    0822361       1/1996

OTHER PUBLICATIONS

Sitarski, Nicholas; U.S. Appl. No. 12/853,353, filed Aug. 10, 2010.

* cited by examiner

Primary Examiner — Hoi Lau
(74) Attorney, Agent, or Firm — Gifford, Krass, Sprinkle, Anderson & Citkowski, P.C.

(57) ABSTRACT

A touch sensor assembly having a selectable sensitivity level allows for a user to activate a touch sensor while wearing hand covers. The touch sensor assembly includes a touch sensor, a comparison unit, and a control unit. The touch sensor has a selectable sensitivity level, and detects a value corresponding to a capacitance of the touch sensor. The comparison unit has a predetermined threshold stored therein, and determines activation of the touch sensor if the detected value exceeds the predetermined value. The control unit is operable to select a sensitivity level of the touch sensor by varying the predetermined threshold by an amount unrelated to an environmental effect on the touch sensor.

20 Claims, 6 Drawing Sheets

TOUCH SENSOR HAVING A SELECTABLE SENSITIVITY LEVEL AND METHOD OF SELECTING A SENSITIVITY LEVEL OF A TOUCH SENSOR

FIELD OF THE INVENTION

The present invention relates to a touch sensor having a selectable sensitivity level and a method for selecting a sensitivity level of a touch sensor. More particularly, the invention relates to a touch sensor which selects a sensitivity level in order to allow a user wearing hand covers to activate the touch sensor.

BACKGROUND OF THE INVENTION

In recent years, more and more electronic devices are utilizing a capacitive switch or touch sensor as the premier form of user interface that facilitates the interaction between the user and the electronic device. Touch sensors are typically in the form of touch sensor pad, touch sensor sliders, touch sensor buttons, or touch sensor displays that operate by way of capacitive sensing.

In order to interact with the electronic device, the touch sensor detects a conductive object, such as a user's finger, by detecting a value corresponding to the human body's capacitance. The touch sensor detects a change in the electrostatic capacity and determines the presence or absence of contact (i.e., activation of the touch sensor) by comparing the detected value with a threshold value. If the detected value exceeds the threshold value the touch sensor is activated, and if the detected value is below the threshold value the touch sensor is not activated.

However, due to the widespread use of touch sensor devices in various different applications, the touch sensor device is often exposed to the elements. Typically in colder climates, users often wear hand covering such as gloves, mittens, or other apparel which protects the user's fingers from frigid temperatures. A disadvantage of the touch sensors is that the touch sensors are calibrated so as to have a specific sensitivity level in order to determine the presence or absence of the conductive object while avoiding the occurrence of misdetection. In order to provide a balance between misdetection and allow for accurate performance, the threshold of the touch sensor device is set so as to activate upon contact with an ungloved or bare human finger.

As such, users dealing with touch sensor devices which are exposed to colder temperatures such as electronic devices or kiosks positioned outside or unheated automotive vehicles exposed to the elements, are required to remove hand covering (i.e. gloves) prior to interaction with the touch sensor device. However, as the touch sensor device is itself exposed to the elements, removal of the hand covers is a major inconvenience for the user as it exposes the user's fingers to the frigid temperature in order for the user's bare finger to interact with the touch sensing device. If the user does not remove the hand covers prior to interaction with the touch sensing device, the hand covering acts as an insulator between the touch sensor and the user's finger thereby significantly decreasing the body capacitance able to be sensed by the touch sensor. As the touch sensor has been calibrated to actuate upon contact of a bare human finger, the contact of the insulated finger does not register and the touch sensor device is not activated.

Figure 2:
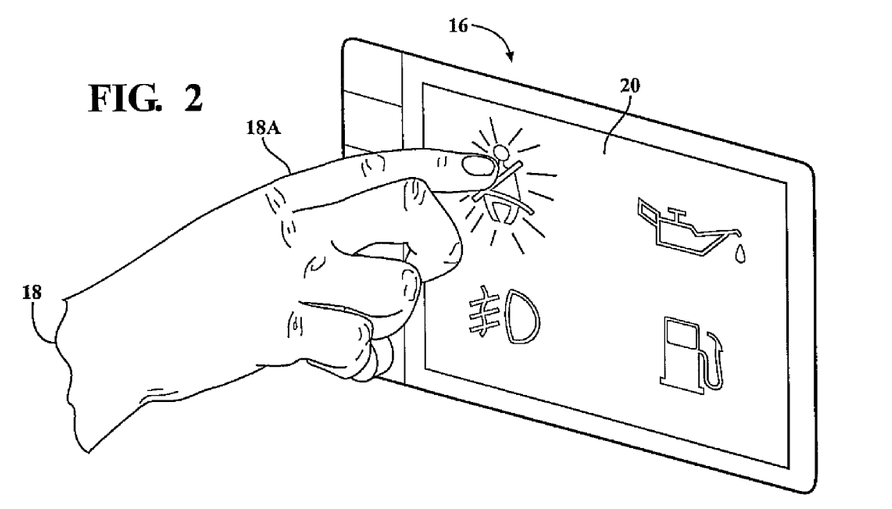
FIG. 2 is a perspective view of a touch sensor assembly being actuated by a finger of a user.
Figure 3:
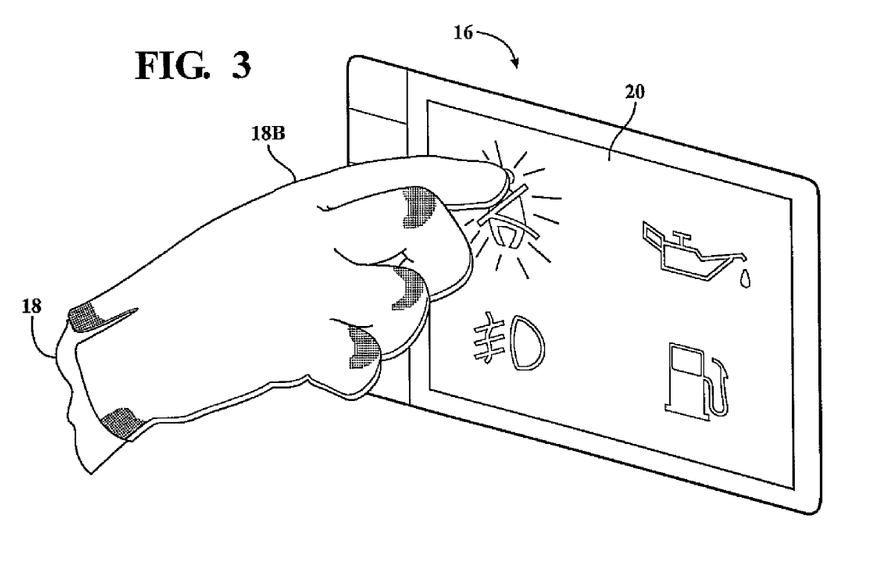
FIG. 3 is a perspective view of the touch sensor assembly being actuated by a user having a hand cover.
Figure 7:
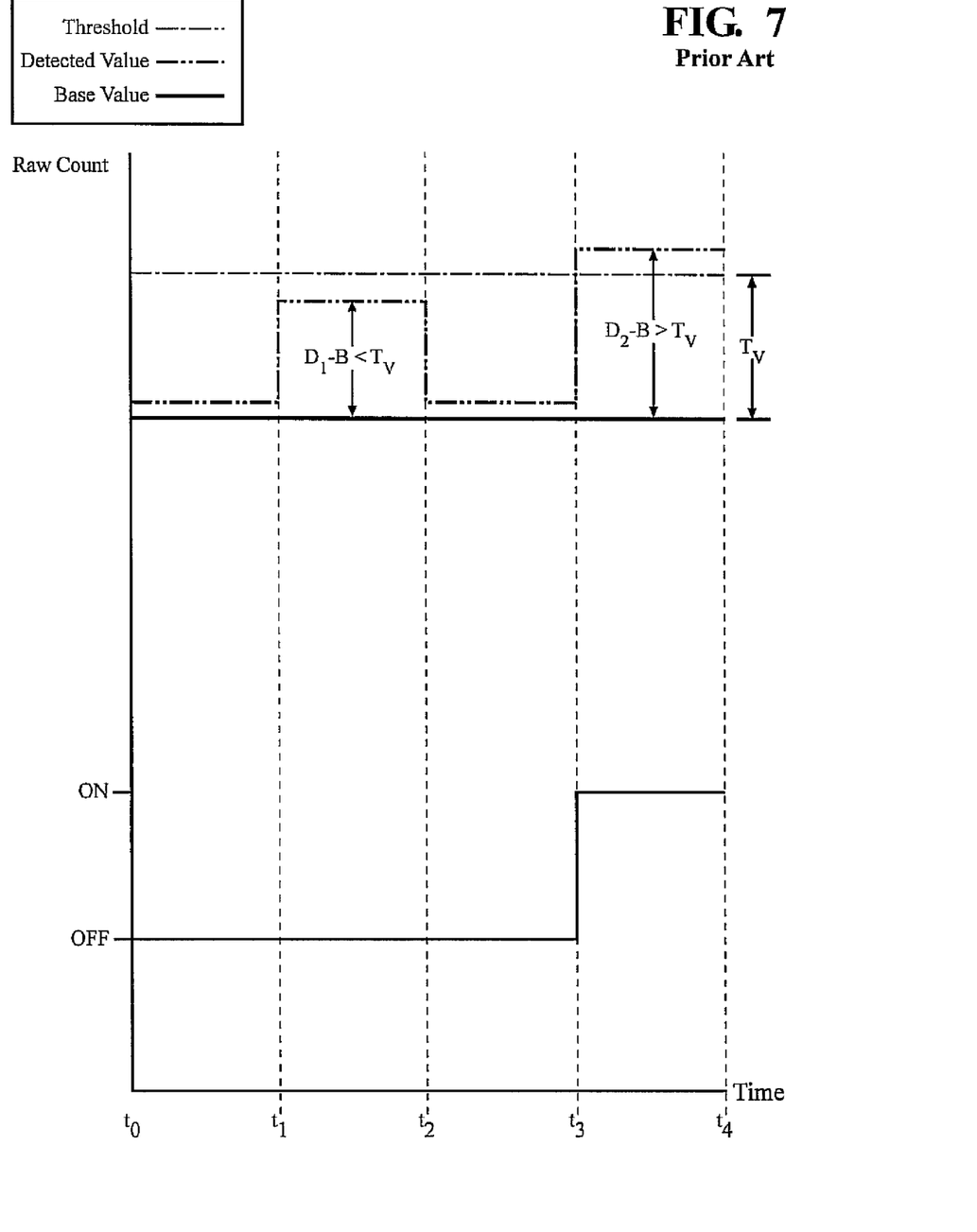
FIG. 7 is a diagram illustrating the detected value and threshold of a prior art touch sensor assembly over time.

With reference to FIG. 7, the operation of a previously known touch sensor operation will be discussed. FIG. 7 illustrates the relationship of the detected value D of the touch sensor and the predetermined threshold T during periods of no contact, contact with a insulated conductive object (such as a user wearing hand covers as seen in FIG. 3), and contact with a conductive object (such as a bare user's finger as seen in FIG. 2). The previously known touch sensor optionally includes a base value B representing a value from which the detected value D and the predetermined threshold T are measured in raw counts (i.e. the greater the capacitance the greater the raw counts). It is appreciated of course that the base value B is optionally set at zero or is an average self capacitance of the touch sensor. In the following explanation the base value B is set to zero (B=0).

The previously known touch sensor of FIG. 7 is provided with a constant predetermined threshold T=100 (having a threshold value of $T_r$=100), and activation of the touch sensor occurs when the detected value D exceeds the predetermined threshold T=100. At time t0 to t1, there is no contact with a conductive object to the touch sensor, and the detected value D=25 which represents the self capacitance of the touch sensor and any environmental effect of the touch sensor which will be described in greater detail below. At time t1 to t2, a conductive object representing an insulated finger (FIG. 3) contacts the touch sensor. As the hand cover acts as an insulator to the body capacitance of the conductive object, the detected value is $D_1$=75 which is less than the predetermined threshold T=100. Accordingly, the touch sensor remains in an OFF state even though the user's finger (insulating by the hand covering) is contacting the touch sensor. In time t2 to t3, no contact is made with the touch sensor. At time t3 to time t4, a conductive object in the form of a bare hand (FIG. 2) contacts the touch sensor, and the detected value is $D_2$=135 which exceeds the threshold T=100. Therefore, the touch sensor is switched to an ON state.

As the self capacitance of the touch sensor increases or decreases directly with the increase or decrease in the temperature or humidity of the environment of the touch sensor, it is known to provide touch sensors that compensate for such an environmental effect. The previously known touch sensors vary either the base value (US Patent Application Publication No. 2008/0047764 to Lee et al.) or the threshold value (U.S. Patent Application Publication No. 2010/0258361 to Yamauchi et al.) to compensate for the change in the detected value due to the environment effects of temperature or humidity. Further, the change in the base value or the threshold value is based on the change in the temperature or humidity and are used to continuously calibrate the touch sensor so as to continuously compensate for variations in temperature and humidity. The previously known touch sensors utilize temperature or humidity sensors or calculated the compensation value due to the change in detected value over time.

Figure 8:
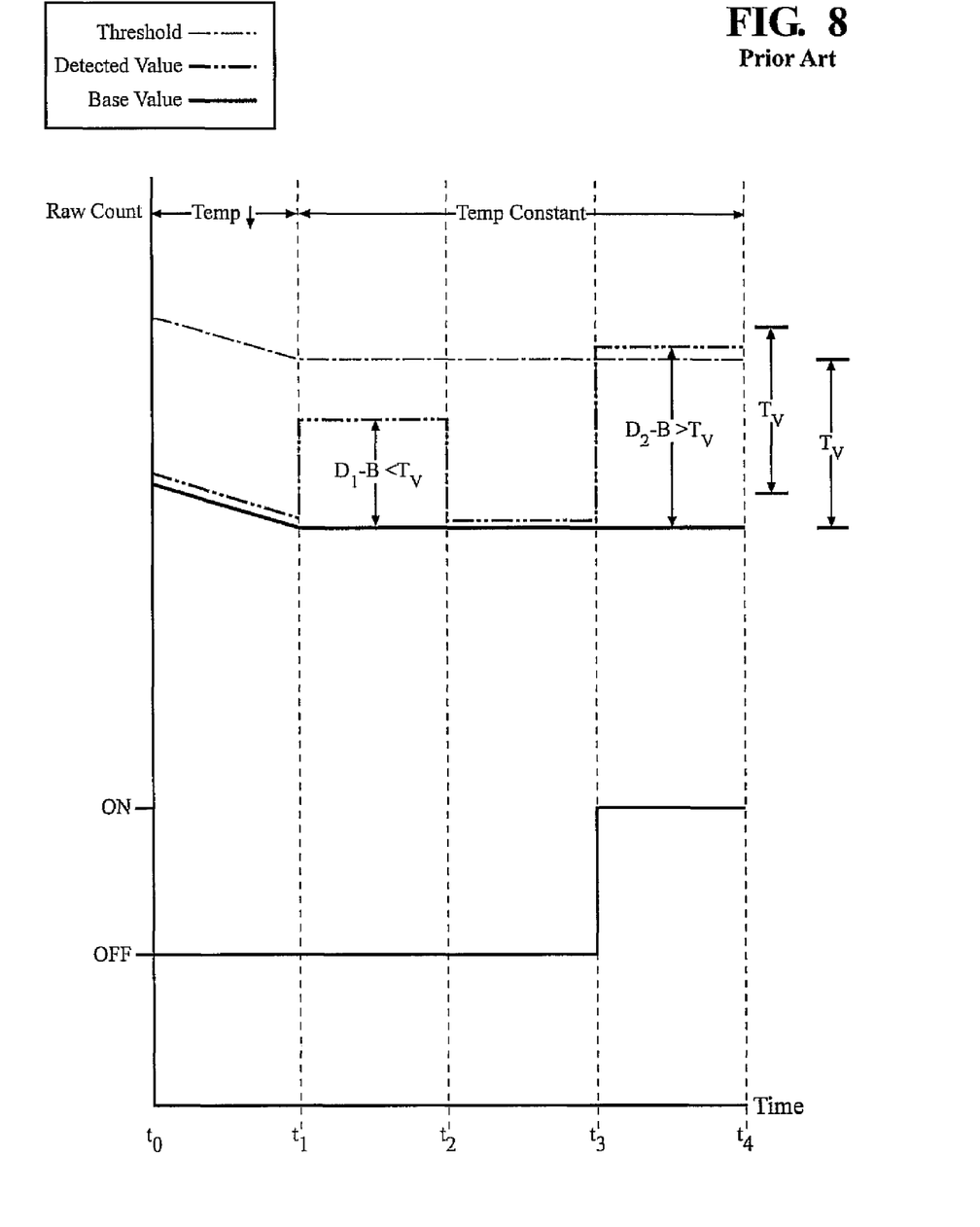
FIG. 8 is a diagram illustrating the detected value and threshold of a prior art environmental effect compensating touch sensor over time.

The compensation for the environmental effects avoids the occurrence of an increase in the detected value due to an increase in temperature such that the detected value exceeds the threshold value even in the absence of user contact with the touch sensor, or the decrease in the detected value due to the decrease in temperature such that the detected value does not exceed the threshold value even in the presence of user contact with the touch sensor. However in the previously known environmental effect compensating touch sensors the difference between the threshold value and the base value is calibrated for detecting contact with a user's bare finger rather than the insulated user's finger due to the user wearing hand covers. As seen in FIG. 8, the relationship of the detected value D of the touch sensor and the compensated threshold T during periods of no contact, contact with a insulated conductive object (such as a user wearing hand covers as seen in FIG.

3), and contact with a conductive object (such as a bare user's finger as seen in FIG. 2). In this example the base value B is initially set to twenty (B=20).

The previously known environmental effect compensating touch sensor of FIG. 8 is provided with an initial threshold T=100. At time t0 there is no contact with a conductive object to the touch sensor, and the detected value D=25. From time t0 to t1, the environment of the touch sensor undergoes a decrease in temperature (from 60° F. to 35° F.) which decreases the detected value from D=25 to D=5, and the touch sensor compensates by reducing the threshold from T=100 to T=80. Although, the previously known compensating touch sensors vary the threshold, the threshold value $T_V$ between the base line and the threshold is held constant at $T_V$=80. Accordingly, the amount the threshold is compensated is directly related to the environmental effect on the touch sensor (i.e. the change in detected value due to the change in temperature and humidity).

At time t1 to t2, a conductive object representing an insulated finger (FIG. 3) contacts the touch sensor. As the hand cover acts as an insulator to the body capacitance of the conductive object, the detected value is $D_1$=50 which is less than the predetermined threshold T=80. Accordingly, the touch sensor remains in an OFF state even with the touch sensor's compensation for the environmental effect and the user's finger (insulating by the hand covering) is contacting the touch sensor. In time t2 to t3, no contact is made with the touch sensor. At time t3 to time t4, a conductive object in the form of a bare hand (FIG. 2) contacts the touch sensor, and the detected value is $D_2$=90 which exceeds the compensated threshold value T=80. Therefore, the touch sensor is switched to an ON state.

However, as the threshold value $T_V$ is held constant, a user wearing a hand cover will be unable to actuate the touch sensor device without removing the hand cover as the relative sensitivity level of the previously noted touch sensor devices remains constant. Specifically, although the threshold or baseline value has been adjusted, that adjustment corresponds to the touch sensor's increase or decrease in self-capacitance corresponding to the environmental effect on the touch sensor. Therefore, a user will be required to remove the hand covering prior to interacting with the touch sensor.

Thus, there exists a need in the art to provide a touch sensing device which is capable of selecting a sensitivity level thereby allowing activation of the touch sensor by a user wearing hand covers.

SUMMARY OF THE INVENTION

The present invention provides a touch sensor assembly having a selectable sensitivity level to allow for a user to actuate the touch sensor while wearing hand covers which overcomes the above described disadvantages.

In brief, the touch sensor assembly includes a touch sensor, a comparison unit, and a control unit. The touch sensor has a selectable sensitivity level, and detects a value corresponding to a capacitance of the touch sensor. The comparison unit has a predetermined threshold stored therein, and determines activation of the touch sensor if the detected value exceeds the predetermined value. The control unit is operable to select a sensitivity level of the touch sensor by varying the predetermined threshold by an amount unrelated to an environmental effect on the touch sensor.

The environmental effect on the touch sensor includes the change in the detected value due to changes in temperature or humidity. The control unit selects the sensitivity level upon receipt of a signal from a determination unit that determines the satisfaction of a condition. The determination unit optionally determines satisfaction of the condition if the user is wearing hand covers. In the alternative, the determination unit includes a temperature sensor and a predetermined temperature value, and compares a detected temperature with the predetermined temperature value. The determination unit determines satisfaction of the condition if the predetermined value exceeds the detected temperature value. The predetermined temperature is set to be a temperature at which a majority of users will presumably be wearing hand covers.

Accordingly, the touch sensor assembly selects a sensitivity level allowing for the user to activate the touch sensor while wearing gloves by varying the predetermined threshold by an amount unrelated to an environmental effect on the touch sensor.

BRIEF DESCRIPTION OF THE DRAWINGS

A better understanding of the present invention will be had upon reference to the following detailed description when read in conjunction with the accompanying drawings, wherein like reference characters refer to like parts throughout the several views, and in which.

DETAILED DESCRIPTION OF THE INVENTION

The present invention provides a touch sensor assembly having a selectable sensitivity level that allows for activation of the touch sensor even if the user is wearing hand covers. The touch sensor assembly overcomes the disadvantages of the previously known touch sensors by allowing the user to interact with the touch sensor without removal of their hand covers. Generally, the touch sensor assembly includes a touch sensor, a comparison unit, and a control unit that selects the sensitivity level by varying the predetermined threshold by an amount unrelated to an environmental effect on the touch sensor. The sensitivity level of the touch sensor being the amount of the detected value required (threshold) to activate the touch sensor. The higher the threshold the higher the sensitivity and the lower the threshold the lower the sensitivity.

Figure 1:
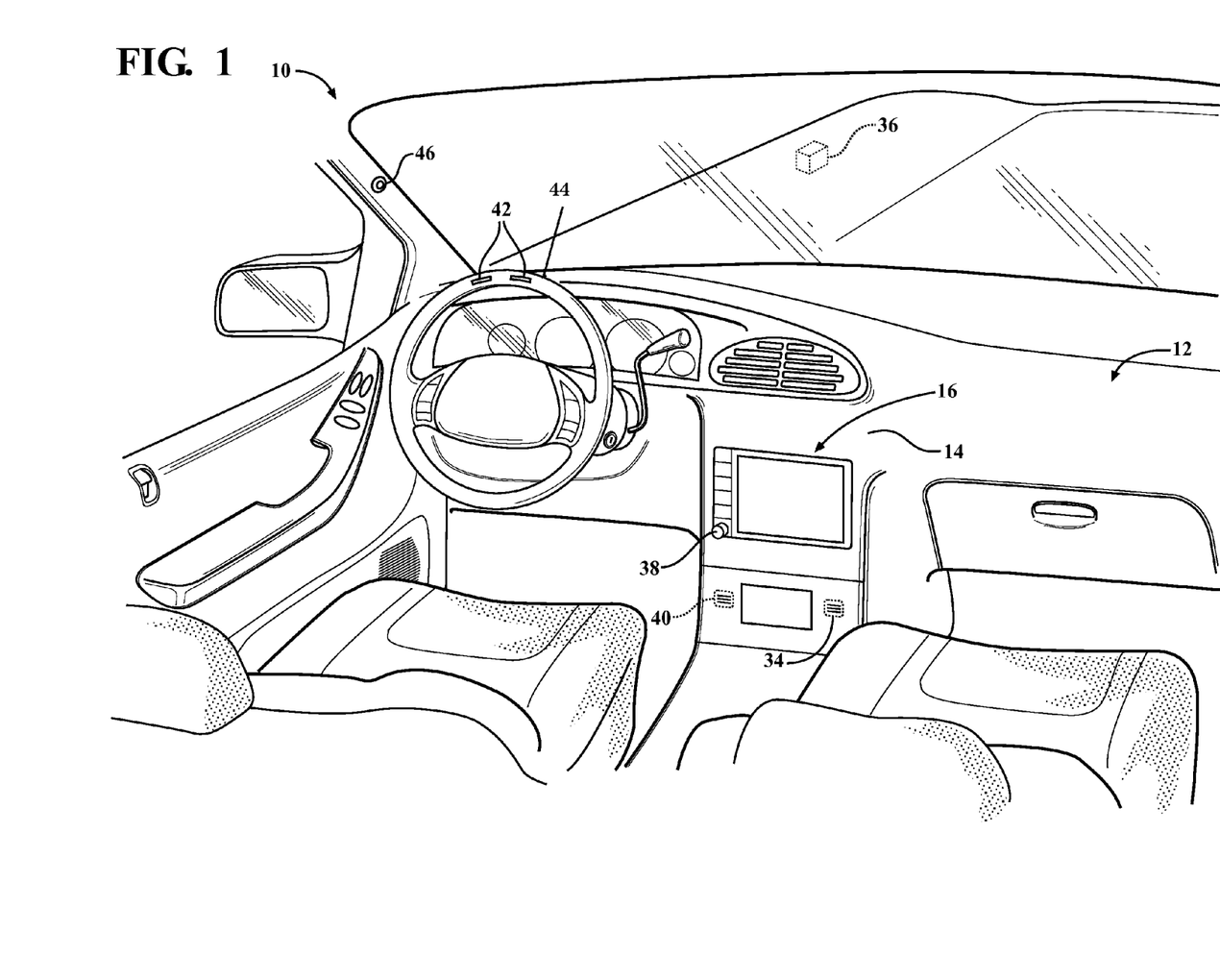
FIG. 1 is an environmental view of a passenger compartment of an automotive vehicle.

FIG. 1 shows an environmental view of an automotive vehicle 10 having an interior passenger compartment 12. A touch sensor assembly 16 is provided in the dashboard 14. The touch sensor assembly 16 is optionally an environmental control system, a GPS system, or an entertainment system which allows for the user to interface the various systems by touching graphics displayed directly on the touch sensor assembly 16 (as seen in FIGS. 2 and 3). The graphics correspond to touch sensors 20 that can be used to control the various systems illustratively including inputting navigation data, controlling the flowrate or temperature of a HVAC system, or adjusting the volume or station of a radio. Although the present invention is shown used in conjunction with a vehicle 10, the touch sensor assembly 16 according to the present invention may be used in other circumstances aside from automotive use including but not limited to personal electronic devices, cellular telephones, and kiosks having touch sensor interfaces.

With respect to FIGS. 2 and 3, the interaction between the touch sensor assembly 16 and a user is illustrated. As seen in FIG. 2, a conductive object 18 in the form of a bare human hand 18A (specifically a human finger) directly contacts the display portion of a touch sensor 20. As will be described in greater detail below, the contact between the bare finger 18A and the touch sensor assembly 16 activates the touch sensor 20 in order to perform the specified function. However, as seen in FIG. 3, when a conductive object 18 in the form of a user's hand having a hand cover 18B contacts the touch sensor 20, the insulating effect of the hand covering prohibits the activation of previously known touch sensors.

Figure 4:
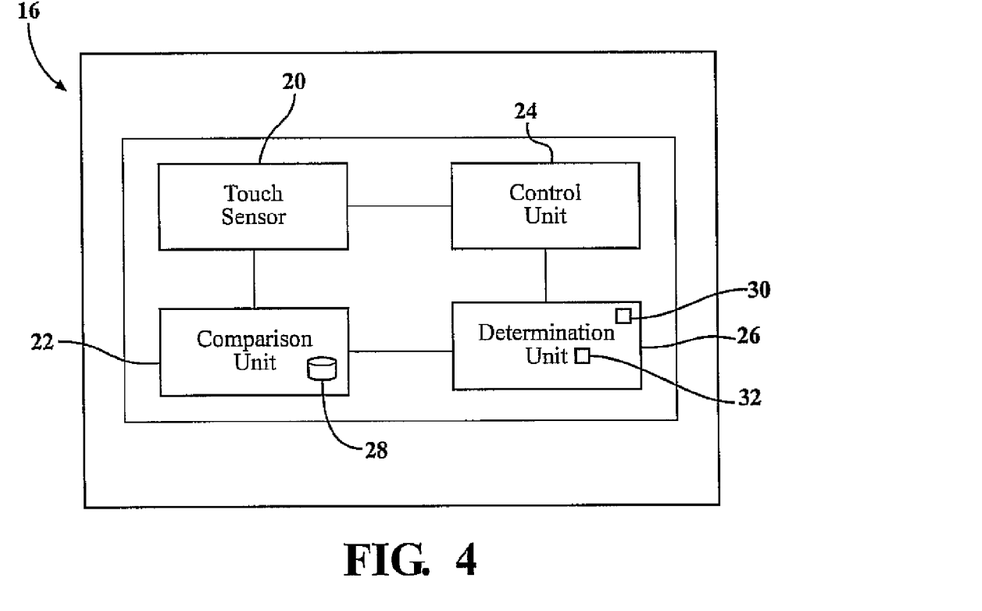
FIG. 4 is a schematic diagram of the touch sensor assembly.

The inventive touch sensor assembly 16 allows for interaction even when a user is wearing hand covers as seen in FIG. 3. With reference to FIG. 4, the touch sensor assembly 16 includes the touch sensor 20, a comparison unit 22, a control unit 24, and a determination unit 26. The touch sensor 20 detects a detected value in the form of an electrical signal corresponding to the capacitance detected by the touch sensor 20. In the absence of human contact with the touch sensor 20, the electrical signal corresponding to the capacitance is known as a self-capacitance. In contrast, upon the contact of a conductive object 18 the touch sensor 20 detects a detected value in the form of an electronic signal corresponding to the body capacitance of the conductive object 18, either conducted object 18A or insulated conductive object 18B.

In order to determine the presence of the conductive object 18, the detected value detected by the touch sensor 20 is transmitted to the comparison unit 22. The comparison unit 22 includes a storage device 28 in which at least one predetermined threshold is stored. Preferably, a plurality of predetermined threshold values each corresponding to an individual sensitivity level are stored in the storage device 28. The comparison unit 22 compares the detected value with the predetermined threshold in order to determine the presence of the conductive object 18 and thereby activate the touch sensor 20. If the detected value is below the predetermined threshold, the comparison unit 22 determines the absence of the conductive object 18 on the touch sensor 20. However, if the detected value exceeds the predetermined threshold, the comparison unit 22 determines the presence of a conductive object 18 on the touch sensor 20 and thereby activates the touch sensor 20.

The control unit 24 is operable to change the sensitivity level of the touch sensor 20 thereby allowing activation even by an insulated conductive object 18B such as a user's hand wearing a hand covers such as a glove. The control unit 24 varies the sensitivity level of the touch sensor 20 by modifying the predetermined threshold. In order to increase the sensitivity level, the selection unit decreases the predetermined threshold by a predetermined amount so that a lower detected value detected by the touch sensor 20 (upon contact with the insulated conductive object 18B) will exceed the varied predetermined threshold thereby indicating the presence of a conductive object 18 and activating the touch sensor 20. The control unit 24 selects a sensitivity level of the touch sensor by decreasing the predetermined threshold by the predetermined amount which is unrelated to the environment effect on the touch sensor 20 upon receipt of a signal from the determination unit 26.

Specifically, the predetermined threshold is decreased by an amount unrelated to the environment effect in order to increase the sensitivity level of the touch sensor 20 so as to allow an insulated conductive object 18B to activate the touch sensor 20. As described in greater detail below, the touch sensor 20 detects a smaller detected value from the insulated conductive object 18B, and by decreasing the predetermined threshold the comparison unit 22 compares the detected value against a lower threshold allowing for the smaller detected value from the insulated conductive object 18B to exceed the lowered threshold value and activate the touch sensor 20. As will be described in greater detail below, the predetermined threshold is not varied until a condition is determined satisfied by the determination unit 26. As such, the temperature or humidity can be changing and acts as the environmental effect on the touch sensor 20; however, the predetermined threshold remains unaffected until the determination of the satisfaction of the condition by the determination unit 26.

In the alternative, the comparison unit 22 is operable in a first mode and a second mode. In the first mode, the comparison unit 22 compares the detected value of the touch sensor 20 to a first predetermined threshold stored in the storage device 28 of the comparison unit 22. In the second mode, the comparison unit 22 compares the detected value of the touch sensor 20 to a second predetermined threshold stored in the storage device 28 of the comparison unit 22. The first predetermined threshold being greater than the second predetermined threshold, and the difference between the first predetermined threshold and the second predetermined threshold being unrelated to the environmental effect on the touch sensor 20. Accordingly, switching from the first predetermined threshold to the second predetermined threshold value allows for a lower detected value, such as from the insulated conductive object 18B, to exceed the predetermined threshold and activate the touch sensor 20.

In order to decrease the predetermined threshold or switch between the first mode and second mode (i.e. the first predetermined threshold and the second predetermined threshold), the control unit 24 receives a signal from the determination unit 26, and the control unit 24 instructs the comparison unit 22. The determination unit 26 transmits the signal to the control unit 24 upon determining the satisfaction of a condition indicating that the user is wearing hand covers. In determination of the satisfaction of the condition, the determination unit 26 includes a sensor 30 and a processor 32. The sensor 30 senses a factor related to the user wearing hand covers and the processor 32 processes the sensed factor so that the determination unit 26 can determine the satisfaction of the condition. The determination unit 26 further signals the control unit 24 to instruct the comparison unit 22 to return the varied predetermined threshold to an initial value or to switch from the second mode back to the first mode when the condition is no longer satisfied or upon the expiration of a predetermined period of time.

One such condition in which a user will be wearing hand covers is the presence of the touch sensor assembly in a low temperature environment such as 32° F. or below. The sensor 30 is optionally a temperature sensor and the processor 32, or the storage device 28 of the comparison unit 22, includes a predetermined temperature value stored therein. The sensor 30 detects a temperature and the processor 32 compares the detected temperature to the predetermined temperature value.

The determination unit 26 determines the satisfaction of the condition if the predetermined temperature value is equal to or exceeds the detected temperature.

For example, when the predetermined temperature value is set as 32° F., and the sensor 30 detects a temperature of 30° F. the processor 32 compares temperatures. As the predetermined temperature value exceeds the detected temperature the determination unit 26 determines the satisfaction of the condition and signals the control unit 24 to increase the sensitivity level by instructing the comparison unit 22 to switch from the first mode to the second mode, or to decrease the predetermined threshold by the predetermined amount unrelated to the environmental effect of the change in temperature on the touch sensor 20. Accordingly, even though the change in the threshold on temperature initiated by the predetermined temperature exceeding the detected temperature, the amount the predetermined threshold is varied is unrelated to the effect of the change in temperature on the touch sensor, specifically, the change in the detected value due to the temperature.

The determination unit 26 continues to determine the satisfaction of the condition and sends a second signal to the control unit 24 to instruct the comparison unit 22 to switch from the second mode to the first mode, or to increase/return the predetermined threshold to the initial predetermined threshold if the detected temperature exceeds the predetermined temperature. For example, if the detected temperature rises from 30° F., which is below the predetermined temperature value of 32° F., to 33° F. the condition is no longer satisfied and the determination unit 26 sends the second signal.

The sensor 30 is optionally an interior temperature sensor 34 disposed in the interior passenger compartment 12 of the automotive vehicle 10 to detect the temperature of the interior passenger compartment 12, or an exterior temperature 36 disposed outside of the passenger compartment to detect the exterior temperature of the automotive vehicle 10.

In the alternative, the sensor 30 is optionally a user actuated input device 38 such as a push button, knob, switch or any other known device. The user actuates the input device 38 and the determination unit 26 determines the satisfaction of the condition. As such, the condition is satisfied by the actuation of the input device 38, and the condition will continue to be satisfied until the user actuates the input device 38 again or upon the expiration of the predetermined time period. This allows a user wearing hand covers to easily actuate the input device 38 (i.e. push a button, toggle a switch, or turn a knob) to select the sensitivity level of the touch sensor 20 to allow for activation of the touch sensor by the insulated conductive object 18B. Further, the input device 38 optionally has a various levels of actuation which allows the user to select a specific sensitivity level which corresponds to one of the predetermined threshold values stored in the storage device 28 of the comparison unit 22.

In addition, the sensor 30 is optionally a microphone 40 and the processor 32 is a voice recognition unit capable of translating spoken instructions of the user. The determination unit 26 determines the satisfaction of the condition upon the processor 32, acting as the voice recognition unit, translates the voice data detected by the microphone 40 into a predetermined key word. Further, the sensor 30 is optionally an electrode sensors 42 located on the steering wheel 44, or an optical sensor 46 captures images of the user's hands on the steering wheel 44. The processor 32 processes the detected data from the electrode sensors 42 or compares the captured image from the optical sensor 46 to stored images to determine whether the driver or other occupant are wearing hand covers.

Figure 6:
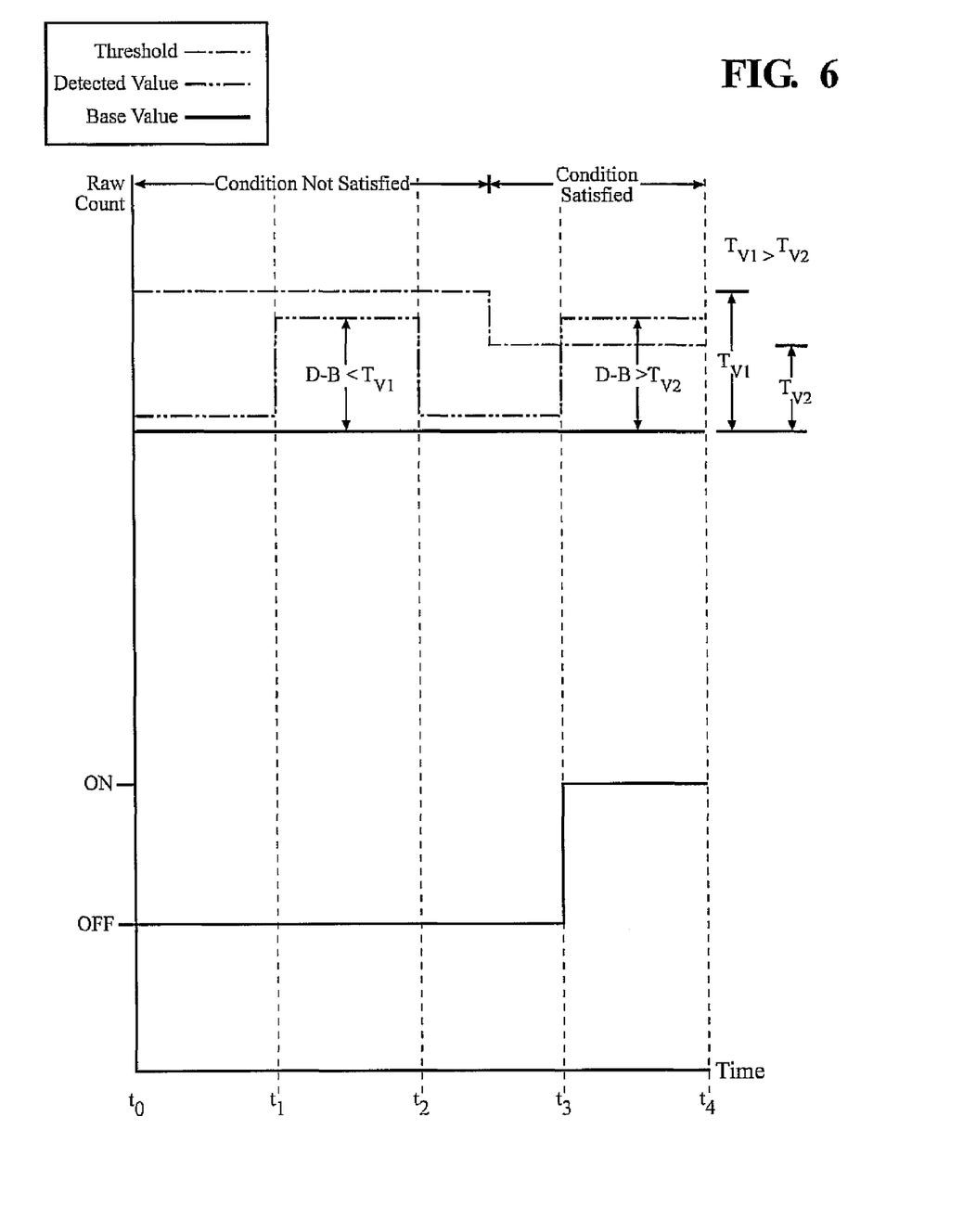

In order to facilitate a better understanding of the invention the relationship of the detected value D of the touch sensor 20 and the predetermined threshold T during periods of no contact, contact with a insulated conductive object 18B, and contact with a conductive object 18A will now be discussed with reference to FIG. 6. The comparison Brit 22 is provided with a predetermined threshold T=100 having threshold value of $T_{V1}$=100, and activation of the touch sensor 20 occurs when the detected value D exceeds the predetermined threshold T. At time t0 to t1, there is no contact between the conductive object 18A or 18B and the touch sensor 20, and the detected value D=5.

At time t1 to t2, a conductive object 18B representing an insulated finger (FIG. 3) contacts the touch sensor 20. As the hand cover acts as an insulator to the body capacitance of the conductive object 18, the detected value is D=75. The comparison unit 22 compares the detected value D=75 with the predetermined threshold value $T_{V1}$=100, and as the detected value is less than the predetermined threshold value the touch sensor remains in an OFF state even though the conductive object 18B (insulating by the hand covering) is contacting the touch sensor 20.

Partially through time t2 to time t3, the determination unit 26 determines that the condition has been satisfied. For example, the user actuates the input device 38, the interior/exterior temperature detected by temperature sensor 34/36 is equal to or below the predetermined temperature (i.e. the detected temperature is 30° F. and the predetermined temperature is 32° F.), the processor 32 acting as the voice recognition unit translates the predetermined key work from voice data detected by microphone 40, the processor 32 processes the detected data from the electrode sensors 42 or compares the captured image from the optical sensor 46 to stored images to determine whether the driver or other occupant are wearing hand covers. Upon the determination unit 26 determining the satisfaction of the condition a signal is transmitted to the control unit 24 to instruct the comparison unit 22 to switch from first mode to second mode (i.e. from the first predetermined threshold value $T_{V1}$=100 to the second predetermined threshold value $T_{V2}$=50) or to decrease the predetermined value by predetermined amount (50) unrelated to the environmental effect on the touch sensor 20. The change in temperature from above the predetermined threshold of 32° F. to below 30° F. may only have an environmental effect on the detected value of ±5; however, the predetermined threshold is decreased by 50 which is unrelated to the environmental effect on the detected value of the touch sensor 20.

At time t3 to time t4, an insulated conductive object 18B (FIG. 3) contacts the touch sensor 20, and the detected value is D=75. The comparison unit 22 compares the detected value D=75 with the predetermined threshold $T_{V2}$=50, and as the detected value exceeds the second predetermined threshold/decreased predetermined threshold the touch sensor 20 is switched to an ON state. As such, due to the decrease in the predetermined threshold, the detected value detected at time t3 through t4 in which the insulated conductive object 18B is in contact with the touch sensor 20 thereby activating the touch sensor.

Figure 5:
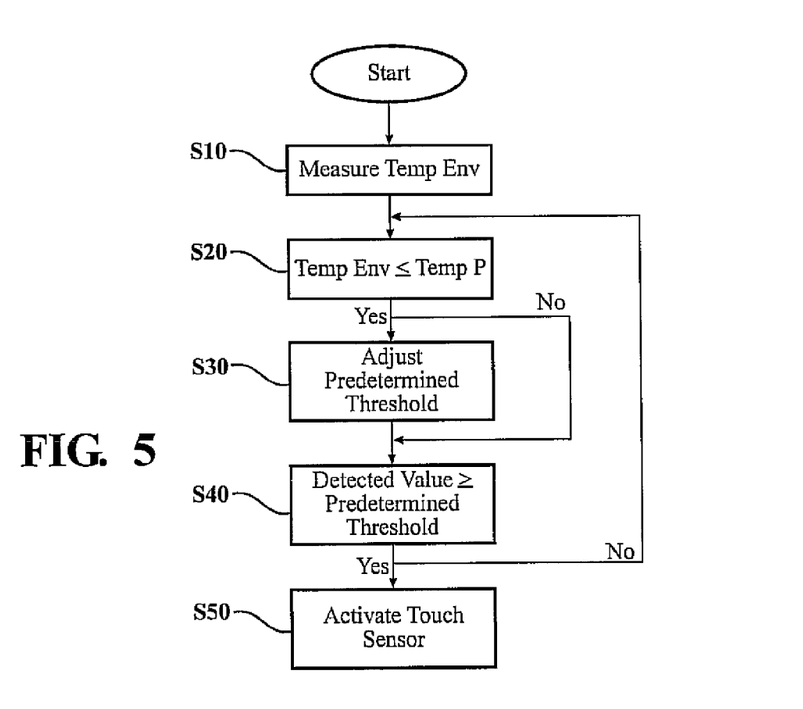
FIG. 5 is a flow chart illustrating the method of selecting a sensitivity level of a touch sensor FIG. 6; is a diagram illustrating the detected value and threshold over time of the touch sensor assembly according to the present invention.

With reference to FIG. 5 the method of selecting a sensitivity level of a touch sensor 20 will now be discussed. In step S10 the sensor 30 measures the temperature (Temp Env) of the environment of the touch sensor 20. The method then proceeds to step S20 where the determination unit 26 determines whether the environment temperature (Temp Env) is equal to or less than a predetermined temperature (Temp P). If the environment temperature (Temp Env) is greater than the predetermined temperature (Temp P) then the method proceeds to step S40. If the environment temperature (Temp Env) is equal to or less than the predetermined temperature (Temp P) then the method proceeds to step S30. In step S30 the control unit 24 instructs the comparison unit 22 to decrease the predetermined threshold by the predetermined amount unrelated to the environmental effect on the touch sensor 20 or switch from a first mode to a second mode.

The method then proceeds to S40 in which the comparison unit 22 compares the detected value detected by the touch sensor 20 to the varied predetermined threshold. If the detected value is less than the decreased predetermined threshold or the second predetermined threshold, the method restarts at step S10. If the detected value is equal to or exceeds the varied predetermined threshold or the second predetermined threshold then the method proceeds to step S50 and the touch sensor 20 is activated.

The invention is not restricted to the illustrated examples and embodiments described above. The embodiments are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the appended claims.

It is claimed:

1. A touch sensor assembly having selectable sensitivity levels to allow a user to operate said touch sensor assembly while wearing hand covers, said touch sensor assembly comprising:
    a touch sensor having a selectable sensitivity level, said touch sensor detects a value corresponding to a capacitance of said touch sensor;
    a comparison unit having a predetermined threshold stored therein, said comparison unit determines activation of said touch sensor when said detected value exceeds said predetermined threshold; and
    a control unit operable to select said sensitivity level of said touch sensor by varying said predetermined threshold by an amount unrelated to an environmental effect on said touch sensor.

2. The touch sensor assembly of claim 1, wherein said control unit selects said sensitivity level of said touch sensor by decreasing said predetermined threshold by a predetermined amount that is unrelated to said environmental effect on said touch sensor.

3. The touch sensor assembly of claim 2, wherein said environmental effect includes the change in said detected value due to temperature or humidity.

4. The touch sensor assembly of claim 3, wherein said control unit selects said sensitivity level upon receipt of a signal from a determination unit that determines the satisfaction of a condition.

5. The touch sensor assembly of claim 4, wherein said condition is whether a user is wearing hand covers, and said determination unit determines satisfaction of said condition if said user is wearing hand covers.

6. The touch sensor assembly of claim 4, wherein determination unit includes a temperature sensor and a predetermined temperature value, said temperature sensor detects a temperature and said determination unit compares said detected temperature with said predetermined temperature value, and wherein said determination unit determines the satisfaction of said condition if said predetermined temperature value exceeds said detected temperature.

7. The touch sensor assembly of claim 4, wherein said determination unit includes an input device actuated by the user.

8. The touch sensor assembly of claim 7, wherein said input device is a voice recognition unit.

9. The touch sensor assembly of claim 4, wherein said determination unit includes an optical sensor that captures an image and compares said captured image to a stored image to determined whether the user is wearing hand covers, and wherein said determination unit determines the satisfaction of said condition if the user is wearing hand covers.

10. The touch sensor assembly of claim 7, wherein said comparison unit includes a plurality of predetermined thresholds and wherein said input device operable to select one of said plurality of predetermined thresholds to be compared to said detected value.

11. A touch sensor assembly having selectable sensitivity levels to allow a user to operate said touch sensor assembly while wearing hand covers, said touch sensor assembly comprising:
    a touch sensor having a selectable sensitivity level, said touch sensor detects a value corresponding to a capacitance of said touch sensor;
    a comparison unit that determines activation of said touch sensor if said detected value exceeds a predetermined threshold, said comparison unit operable in a first mode in which said detected value is compared to a first predetermined threshold and a second mode in which said detected value is compared to a second predetermined threshold;
    a temperature sensor; and
    a control unit connected to said temperature sensor to receive a detected temperature, said control unit operable to select said sensitivity level of said touch sensor by comparing said detected temperature to a predetermined temperature and executing said first mode if said predetermined temperature is below said detected temperature and executing said second mode if said predetermined temperature exceeds said detected temperature.

12. The touch sensor assembly of claim 11, wherein said first predetermined threshold is greater than said second predetermined threshold.

13. The touch sensor assembly of claim 11, wherein said touch sensor is disposed in an automotive vehicle, and wherein said temperature sensor measures a temperature of an interior passenger compartment of said automotive vehicle.

14. The touch sensor assembly of claim 11, wherein said touch sensor is disposed in an automotive vehicle, and wherein said temperature sensor measures a temperature of an exterior environment of said automotive vehicle.

15. A method for selecting a sensitivity level of a touch sensor, said method comprising the steps:
    detecting a value corresponding to a capacitance of the touch sensor;
    determining activation of the touch sensor when said detected value corresponding to capacitance of the touch sensor exceeds a predetermined threshold;
    detecting a temperature of an environment of the touch sensor;
    comparing said detected temperature to a predetermined temperature to switch the touch sensor between a first mode in which said detected value is compared to a first predetermined threshold and a second mode in which said detected value is compared to a second predetermined threshold; and
    adjusting the touch sensor to said first mode when said predetermined temperature is below said detected temperature and adjusting the touch sensor to said second mode when said predetermined temperature exceeds said detected temperature;

wherein a difference between said first predetermined threshold and said second predetermined threshold is an amount unrelated to an environmental effect on detecting said value corresponding to said capacitance of the touch sensor by said detected temperature.

16. The method of claim 15, wherein said environmental effect includes the change in said detected value due to temperature or humidity.

17. The method of claim 15, wherein said touch sensor is disposed within an automotive vehicle.

18. The method of claim 15, wherein said first predetermined threshold is greater than said second predetermined threshold.

19. The touch sensor assembly of claim 11, wherein a difference between said first predetermined threshold and said second predetermined threshold is an amount unrelated to an environmental effect on detecting said value corresponding to said capacitance of said touch sensor by said detected temperature.

20. The touch sensor assembly of claim 19, wherein said first predetermined threshold is greater than said second predetermined threshold.

* * * * *